(12) United States Patent
Feldner et al.

(10) Patent No.: US 6,300,235 B1
(45) Date of Patent: *Oct. 9, 2001

(54) METHOD OF FORMING MULTI-LEVEL COPLANAR METAL/INSULATOR FILMS USING DUAL DAMASCENE WITH SACRIFICIAL FLOWABLE OXIDE

(75) Inventors: Klaus Feldner, Dresden; Virinder Grewal, Ebersberg, both of (DE); Bernd Vollmer; Rainer Florian Schnabel, both of Wappinger Falls, NY (US)

(73) Assignee: Siemens Aktiengesellschaft, Munich (DE)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/884,861

(22) Filed: Jun. 30, 1997

(51) Int. Cl.[7] .................................................. H01L 21/44
(52) U.S. Cl. ........................... 438/618; 438/700; 438/637
(58) Field of Search ..................................... 438/626, 637, 438/640, 700, 698, 618

(56) References Cited

U.S. PATENT DOCUMENTS

| 5,444,020 | 8/1995 | Lee et al. ............................. 437/195 |
| 5,449,644 | * 9/1995 | Hong et al. . |
| 5,614,765 | * 3/1997 | Avanzino et al. .................... 257/774 |
| 5,733,712 | * 3/1998 | Tanaka et al. . |
| 6,686,354 | * 11/1997 | Avanzino et al. . |

FOREIGN PATENT DOCUMENTS

| 0726596 | 8/1996 | (EP) . |
| 0763850 | 3/1997 | (EP) . |

OTHER PUBLICATIONS

S. Wolf and R. Tauber "Silicon Processing for the VLSI Era vol. I." (Lattice Press, Calif.) pp. 546–551, 1986.*
Peter Singer: "Making the Move to Dual Damascene Processing" Semiconductor International, vol. 20, No. 9, Aug. 1997 (pp. 79–82).

* cited by examiner

Primary Examiner—Caridad Everhart
(74) Attorney, Agent, or Firm—Stanton C. Braden

(57) ABSTRACT

An improved method of performing a dual damascene etch through a layer stack disposed above a substrate. The layer stack includes an underlying device layer and an insulating layer disposed above the underlying device layer. The method includes forming a trench in a top surface of the insulating layer such that the trench is positioned over the underlying device layer and separated therefrom by insulating material at a bottom of the trench. The method also includes, depositing flowable oxide over the top surface of the insulating layer and into the trench followed by planarizing the flowable oxide down to about a level of the top surface of the insulating layer. Further, the method includes, etching through the flowable oxide within the trench and through insulating material at the bottom of the trench down to the underlying device layer to form a via.

23 Claims, 5 Drawing Sheets

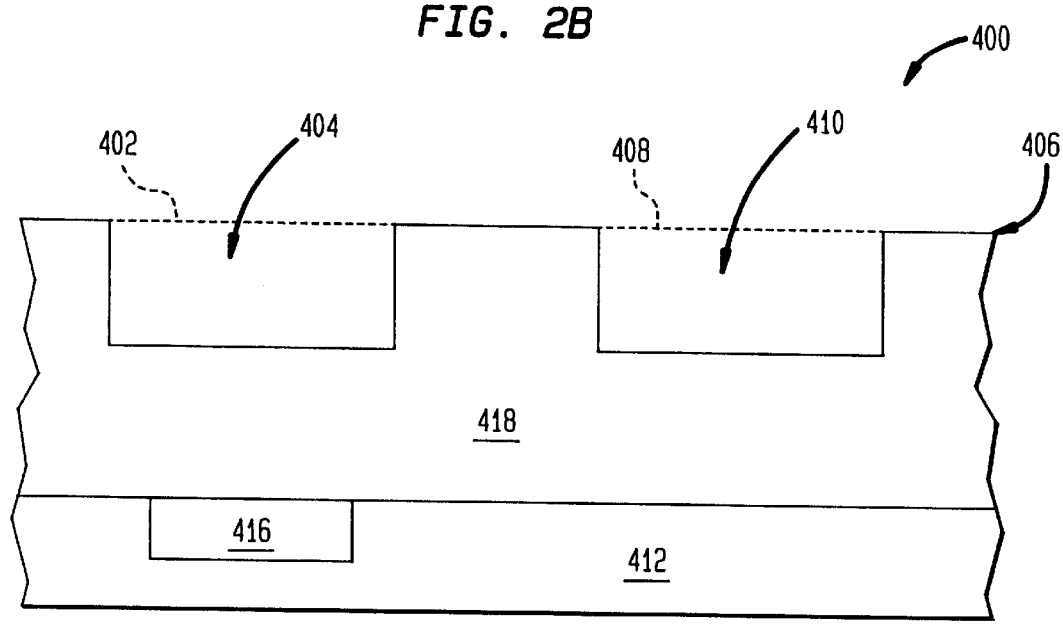
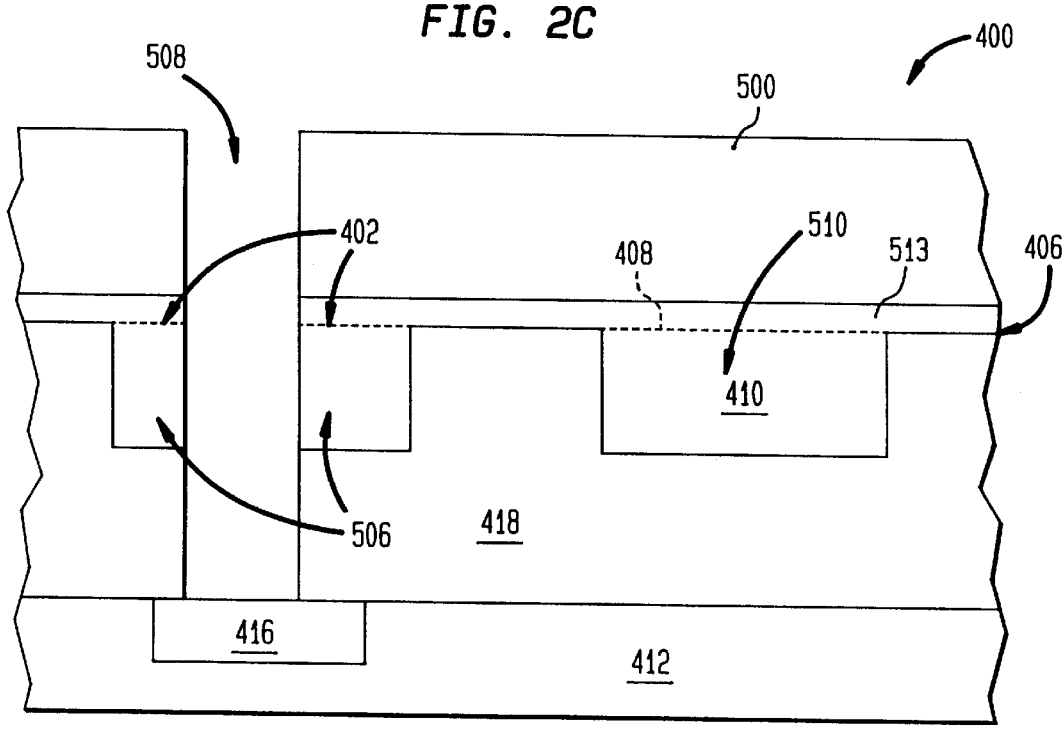

METHOD OF FORMING MULTI-LEVEL COPLANAR METAL/INSULATOR FILMS USING DUAL DAMASCENE WITH SACRIFICIAL FLOWABLE OXIDE

BACKGROUND OF THE INVENTION

The present invention relates to semiconductor devices and more particularly, to improved methods of forming multi-level coplanar metal/insulator films using dual damascene with sacrificial flowable oxide.

Semiconductor manufacturers must continually improve the power and performance of semiconductor devices while keeping the device size to a minimum. In an effort to maintain a small device size, most semiconductor manufacturers reduce individual components of the device to minimal dimensions. Further, manufacturers are vertically integrating more and more of these components, as opposed to using only horizontal integration to reduce the device area consumed by the components. Vertical integration is typically achieved by using several conductive layers in the device and interconnecting these layers using, for example, inter-level contacts known in the art as vias or via interconnects.

As individual component dimensions become smaller, it becomes more difficult to interconnect the various conductive layers. A recent approach to solving the problem of interconnecting the various conductive layers involves etch and mask sequences generally known in the art as damascene techniques. The damascene technique involves forming a plurality of trenches in a layer of insulator and subsequently filling them with metal which is then polished down to the surface of the insulator to form the desired metal pattern. In a process generally known as dual damascene, both the metal trenches as described above and the via interconnects electrically connecting the aforementioned metal pattern and various other conductive layers are typically filled substantially simultaneously. In the conventional dual damascene technique, via interconnects are typically formed substantially simultaneously with the overlying metallization. This technique requires that the holes through the insulator (the holes will eventually be filled with metal or other conductive material to form the via) be formed prior to the deposition of the layer of photoresist used in the subsequent patterning of overlying metallization.

By way of example, FIG. 1A is a cross sectional illustration of a semiconductor substrate 118 with underlying conductive layer 116 overlaid with a layer of insulator 108 having a via hole 115. In the conventional damascene technique, the patterning of an overlying metallization layer that is to be formed is performed after via hole 115 is etched. Referring to FIG. 1B, prior to the deposition of the photoresist layer 102 used in patterning of the metal layer, a layer of anti-reflective coating 113 (known in the art and referred hereinafter as ARC) is conventionally deposited on the upper surface of the layer of insulator 108. The ARC improves lithographic resolution. The ARC deposition operation results in a layer of ARC residue 114 within via hole 115 extending to approximately a height "t" above the conductive layer 116. Subsequent to the formation of ARC layer 113, a photoresist layer 102 is conventionally deposited upon the ARC layer 113. The photoresist is then selectively exposed with a pattern from a mask. Depending on whether a positive or negative resist is used, either the exposed or unexposed portions are removed during development to create regions 110 and 112. However, as can be seen in FIG. 1B, ARC layer 114 is substantially unaffected by the photoresist strip operation.

In order to form the plurality of trenches, both portions of ARC layer 113 and insulator 108 are removed in regions 110 and 112 unprotected by the photoresist. The removal is accomplished by exposing the wafer to a first etch process which breaks through the organic ARC layer 113 followed by a second etch to create the desired trench in the insulator 108. However, the ARC residue 114 in via hole 115 reacts with etch by-products and forms a sidewall within via hole 115. This sidewall within via hole 115 inhibits the action of the ARC and oxide etch operations and results in the creation of what is referred to in the art as a fence (218 in FIG. 1C). Fence 218 is generally substantially the same height "t" as the ARC residue discussed above. FIG. 1C is a cross sectional illustration of a semiconductor substrate 118 with underlying metallization 116 overlaid with a layer of insulator 108 subsequent to overlying metal lithography resist strip using conventional damascene techniques showing the presence of fence 218.

As is known in the art, proper metal reflow is highly dependent upon the surface geometry of the surface onto which the metal is deposited. The presence of fence 218 disrupts the flow of metal which prevents a smooth flow of metal into via trench 212. This disruption of the flow of metal into via trench 212 may result in the formation of voids within via hole 115 the presence of which substantially increases the electrical contact resistance of the via as formed. The voids may also present unacceptable reliability problems since all the current flowing through the via must be carried by the unvoided portions of the via. In this manner, high current densities through the unvoided portions of the via may result in electromigration of the via metal. Electromigration of the via metal may result in long term unacceptable Failure In Time (FIT) rates. In some cases, fence 218 may cause the formation of an electrical open by preventing sufficient metal flow into via hole 115 or via trench 222 to form an electrical contact with the underlying conductive layer 116.

To address this problem, another prior art technique involves forming the trenches on the surface of the insulating layer prior to forming the via hole. However, the surface of the insulating layer is not planarized to facilitate etching of the via hole. In other words, no sacrificial material is deposited into the trenches for the purpose of planarizing the insulator surface to facilitate etching of the via hole. Accordingly, the ARC and photoresist materials, which are deposited to form the via mask to facilitate via etching, get deposited into the trenches and generally conform to the irregularities on the insulator surface. The depressions and projections on the irregular insulator surface renders the ARC and photoresist materials difficult to remove after the via hole etch. Additionally, it is also found that the depressions and projections on the irregular insulator surface present difficulty for photoresist to resolve small surface geometries.

Thus there is a need for techniques to eliminate the fences created by the conventional dual damascene technique as well as creating substantially planar surfaces suitable for resolution of small surface geometries.

SUMMARY OF THE INVENTION

Broadly speaking, the present invention relates to semiconductor devices and more particularly, to an improved method of performing a dual damascene etch through a layer stack disposed above a substrate. According to one embodiment of the invention, the layer stack includes an underlying conductive layer and an insulating layer disposed above the underlying conductive layer. The method includes the following operative steps. First, forming a trench in a top surface of the insulating layer such that the trench is positioned over the underlying conductive layer and separated therefrom by insulating material at a bottom of the trench. Next, depositing flowable oxide over the top surface of the insulating layer and into the trench followed by planarizing the flowable oxide down to about a level of the top surface of the insulating layer. Finally, etching through the flowable oxide within the trench and through insulating material at the bottom of the trench down to the underlying conductive layer to form a via.

In another embodiment, a method of forming a via configured for connecting an underlying device layer and an overlying conductor of a layer stack is disclosed. In the disclosed embodiment, the overlying conductor is configured to be disposed in a trench formed in an insulating layer and spaced apart from the underlying device layer by insulating material at a bottom of the trench. The method includes the steps of: depositing flowable oxide over the top surface of the insulating layer and into the trench; planarizing the flowable oxide down to at least about a level of the top surface of the insulating layer; and etching through the flowable oxide within the trench and through the insulating material at the bottom of the trench down to at least the underlying device layer to form the via.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention is illustrated by way of example, and not by way of limitation, in the figures of the accompanying drawings. In the following figures, like reference numerals refer to analogous or similar elements to facilitate ease of understanding.

FIG. 2B shows, in accordance with one embodiment of the present invention, a cross sectional illustration of a semiconductor structure as shown in FIG. 2A after the flowable oxide layer has been etched back so as to be substantially coplanar to the upper surface of the insulator.

FIG. 2C shows, in accordance with one embodiment of the present invention, a cross sectional illustration of a semiconductor structure as shown in FIG. 2B subsequent to the formation of a via hole.

DETAILED DESCRIPTION OF THE PREFERRED EMBODIMENTS

The present invention will now be described in detail with reference to a few illustrative embodiments as provided illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

The invention relates to an improved method for forming multi-level coplanar metal/insulator films. According to the invention, dual damascene with sacrificial flowable oxide is used to form an overlying metallization layer substantially simultaneously with electrical interconnections to an underlying device layer.

In one embodiment of the invention, a via is formed through an insulator layer to an underlying device layer using a dual damascene etch with flowable oxide. In the described embodiment, a trench suitable for deposition of metal is then formed in the top surface of the insulator layer positioned over the underlying device layer. A layer of flowable oxide then covers the top surface of the insulator layer and is then planarized to about a level of the top of the insulator layer. Advantageously, planarization of the flowable oxide forms a substantially planar surface which is amenable to both photolithographic resolution of small surface geometries and easy removal of subsequently deposited photolithographic material. The via is then formed by etching through the flowable oxide within the trench and through the insulating material at the bottom of the trench to the underlying device layer.

Embodiments of the invention are discussed below with reference to FIGS. 2A–3. However, those skilled in the art will readily appreciate that the detailed description given herein with respect to these figures is for explanatory purposes as the invention extends beyond these limited embodiments.

Figure 1A:
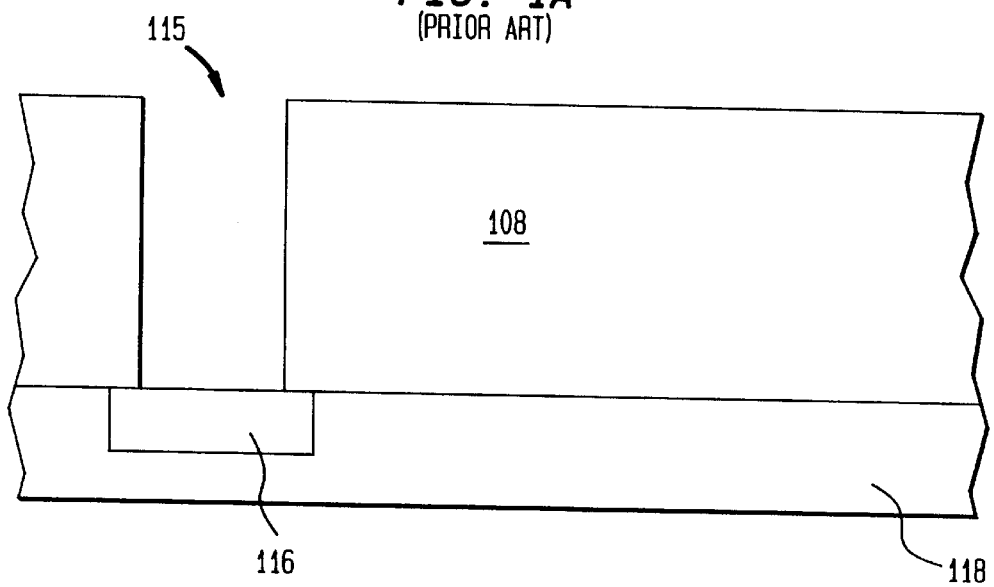
FIG. 1A is a cross sectional illustration of a semiconductor substrate with underlying conductive layer overlaid with a layer of insulator subsequent to the formation of via hole using conventional dual damascene techniques.
Figure 1B:
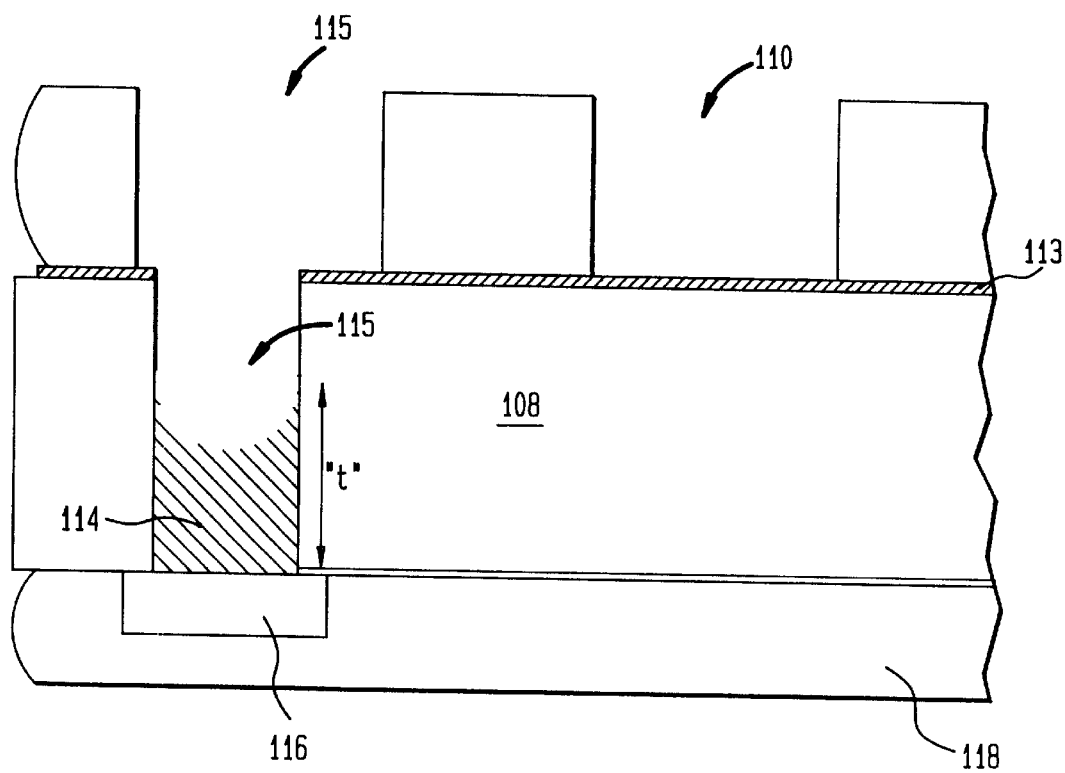
FIG. 1B is a cross sectional illustration of a semiconductor substrate with underlying metallization overlaid with a layer of insulator as shown in FIG. 1A subsequent to development of metal lithography photoresist.
Figure 1C:
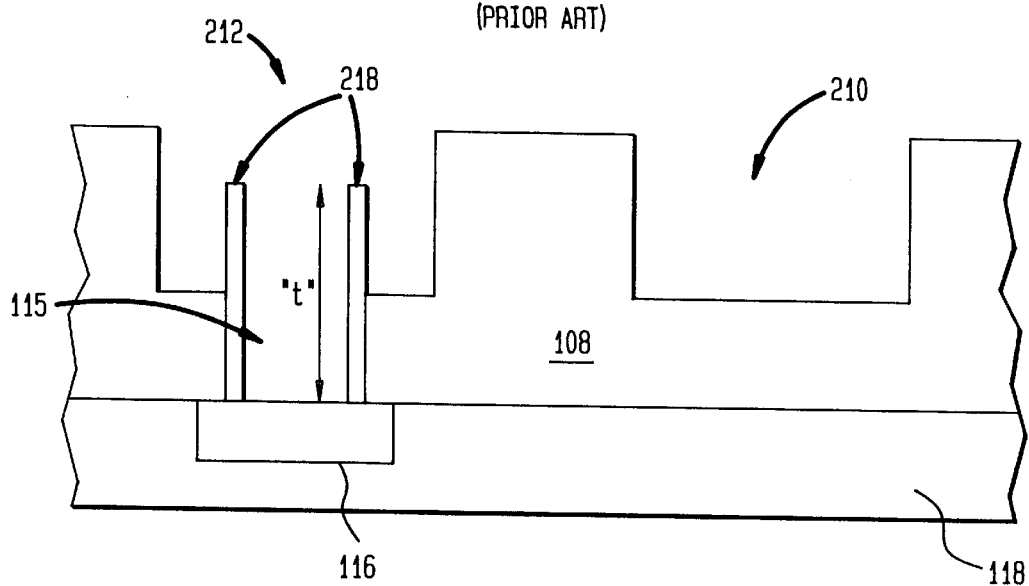
FIG. 1C is a cross sectional illustration of a semiconductor substrate with underlying metallization overlaid with a layer of insulator as shown in FIG. 1B subsequent to metal lithography resist strip.
Figure 2A:
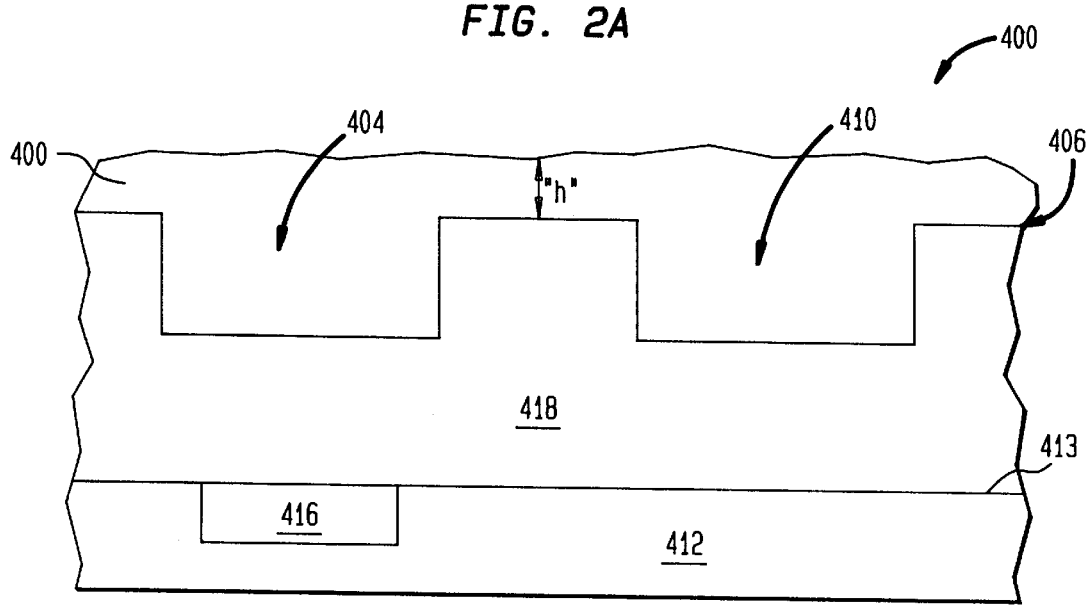
FIG. 2A illustrates a cross sectional view of a stage of formation of a semiconductor structure 400 in accordance with one embodiment of the present invention.

FIG. 2A illustrates a cross sectional view of a structure 400 in accordance with one embodiment of the present invention. As shown, the structure comprises a substrate 412, such as silicon wafer. Other semiconductor substrates such as gallium arsenide, germanium, silicon on insulator (SOI), or other semiconductor materials are also useful. The substrate, for example, may be lightly or heavily doped with dopants of a pre-determined conductivity to achieve a desired electrical characteristics. The structure, for example, represents a structure employed to fabricate devices such as transistors including nFETs or pFETs (field effect transistors) and other devices including capacitors and resistors. Such devices, for example, are interconnected to form an integrated circuit (IC). Such IC includes a random access memory (RAM), a dynamic random access memory (DRAM), a synchronous DRAM (SDRAM), and a read only memory (ROM). Other IC that is formed includes an application specific integrated circuit (ASIC) or any logic circuit. Typically, a plurality of ICs are formed on the wafer in parallel. After processing is finish, the wafer is diced to separate the ICs to individual chips. The chips are then packaged, resulting in a final product that is used in, for example, consumer products such as computer systems, cellular phones, personal digital assistants (PDAs), and other products. However, the invention is described in the context of forming an IC for ease of understanding. Further, the IC can be in any stage of processing.

Illustratively, the substrate includes features (not shown) formed in/on the substrate. The features correspond to devices that form an IC. Included on the IC is a previously defined device layer 416 wherein contact with another conductive layer is desired. Typically, the device layer is isolated from other device layers or features by a dielectric material, which are planarized to result in a planar surface 413. Device layer 416, for example, represents a portion of an underlying metallization layer. Alternatively, the device layer is a highly doped silicon, polysilicon layer, or a portion of any type of an active device such, for example, the source or drain region of a transistor. In one embodiment, device layer 416 represents a bitline of a DRAM IC.

An insulator layer 418 is provided over surface 413. The insulator layer comprises a dielectric material such as silicon oxide. Other materials such as doped silicate glass including phosphosilicate glass (PSG), borosilicate glass (BSG), or borophoshosilciate glass (BPSG). Other insulator material also includes, for example, a polymer like polyimide. The insulator layer can be deposited on the substrate by, for example, chemical vapor deposition (CVD) or other deposition techniques. In this embodiment, the insulator layer 418 may have a thickness in the range of about 0.9 to 2.0 microns. To provide a planar top surface, the insulator layer is typically planarized.

Conventional lithographic techniques are employed to patterned the insulator layer to form a first trench 404. Such techniques, for example, include depositing ARC and photoresist layers 513 and 500, respectively, on the surface of the wafer, covering the insulator layer. Using a mask containing a pattern, the resist layer is selectively exposed with radiation, such as deep ultra-violet (DUV) or extreme ultra violet (EUV) from an exposure source. Other exposure sources generating radiation having wavelengths that are different from DUV and EUV are also useful. Depending on whether a positive or negative resist is used, the exposed or unexposed portion of the resist layer is removed during development to expose a portion of the insulator layer corresponding to trench 404. The wafer is then etched anisotropically in an etch chamber to form the trench. An anisotropic etch process, for example, includes reactive ion etching (RIE). Typically, a first anisotropic etch process is utilized to breaks through the organic ARC layer. An etchant such as $N_2$ can be used to etch the ARC layer. Thereafter, a second anisotropic etch removes a desired amount of insulator material to create the trench. $C_4F_8$ and $O_2$, for example are used as etchant source gases to etch the insulator layer.

As shown, trench 404 represents an overlying metallization layer that is to be contacted with underlying device layer 416. The overlying metallization, for example, is a conductive line. The conductive line is electrically connected to device layer 416 by a subsequently formed via hole, which will be discussed later. The conductive layer is to be contacted with region 416. As such, the position of trench 410 is above region 416. Other trenches, such as trench 410, representing conductive lines are located over other defined regions with which electrical contact is desired. The depth and width of the trenches depend on the design parameters, such as sheet resistance and materials used. Typically, the etch is timed to achieve the desired depth. In some embodiments, a second insulator layer (not shown) is deposited over the insulator layer 418. The second insulator comprises, for example, a dielectric which is different from the first insulator material and can be etched selective thereto. This allows the first insulator material to serve as an etch stop, thereby defining the depth of the trench. As such, the first insulator material need not be as thick, while the second insulator layer has a thickness equal to about the thickness of the conductive line defined by the trenches. Subsequent to the formation of trenches 404 and 410, a layer of flowable oxide 400, referred to as spin on glass (SOG), is deposited upon the upper surface 406 of insulator 418. In the described embodiment, flowable oxide is a polymeric compound that forms $SiO_2$. The flowable oxide, for example, is FOx which is manufactured by Corning. Other flowable oxides and SOGs are also useful. In one embodiment, FOx is used to fill the trenches. The FOx is deposited by a spin on process or by any other conventional deposition techniques. By way of example, the flowable oxide may be formed by coating the substrate with a layer of hydrogen silesquioxane in a conventional SOG spin coater. In one case, the coating material may be spun on at about 1000–5000 RPM while baking the substrate in a sequence of about 150° C. for about one minute, about 250° C. for about one minute, and about 350° C. for about one minute. It may be permissible, in some cases, to eliminate the curing step since the flowable oxide is a sacrificial layer. The layer 400 is sufficiently thick to fill the trenches. The flowable oxide, for example, extends approximately to at least a desired thickness "h" above the upper surface 406 of insulator 418. Typically, h depends on process control parameters. By way of example, layer 400 may be about 500 nm thick in some cases.

As shown in FIG. 2B, the flowable oxide layer 400 is then etched back so as to be substantially coplanar to the upper surface 406 of the insulator 418. In the described embodiment, the upper surface 406 of insulator 418 is used as an etch stop. In this manner, a substantially planar surface 402 is formed covering trench 404 substantially simultaneously with a substantially planar surface 408 that covers trench 410. Advantageously, the upper surface 406 of insulator 418 together with the surfaces 402 and 408 present a substantially planar surface suitable for resolution of small surface geometries using photolithography.

Referring to FIG. 2C, forming a via suitable for interconnecting an underlying device layer and an overlying metallization through an insulator layer may include the following operations. First depositing an ARC layer 513 (which is typically organic in nature) and a photoresist layer 500 on the upper surface 406 of insulator 418 and surfaces 402 and 408. Next, the photoresist layer 500 is developed by methods well known in the art in preparation for etching the flowable oxide within the previously existing trench 404 and insulator 418 at the bottom of previously existing trench 404 to form via hole 508. The organic ARC layer 513 may be etched by placing the wafer in an oxide etch chamber where a first etch process known in the art as RIE utilizing $N_2$ etchant source gas breaks through the organic ARC layer 513 in the areas exposed by the developed photoresist. Once ARC layer 513 is etched, the via hole 508 is formed by etching through the flowable oxide 506 included in previously existing trench 404 using $C_4F_8$ etchant source gas and a first quantity of $O_2$ etchant source gas followed by etching through insulator 418 using $C_4F_8$ etchant source gas and the second quantity of $O_2$ etchant source gas using device layer 416 as an etch stop. In the described embodiment, the first quantity of $O_2$ etchant source gas may be greater than the second quantity of $O_2$ etchant source gas.

The flowable oxide within previously existing trench 410 may be removed in a similar manner using insulator 518 as an etch stop. In one embodiment, the flowable oxide is removed by etching the substrate via a RIE etch using, for example, Ar, $C_4F_8$, CO and/or $O_2$.

Figure 2D:
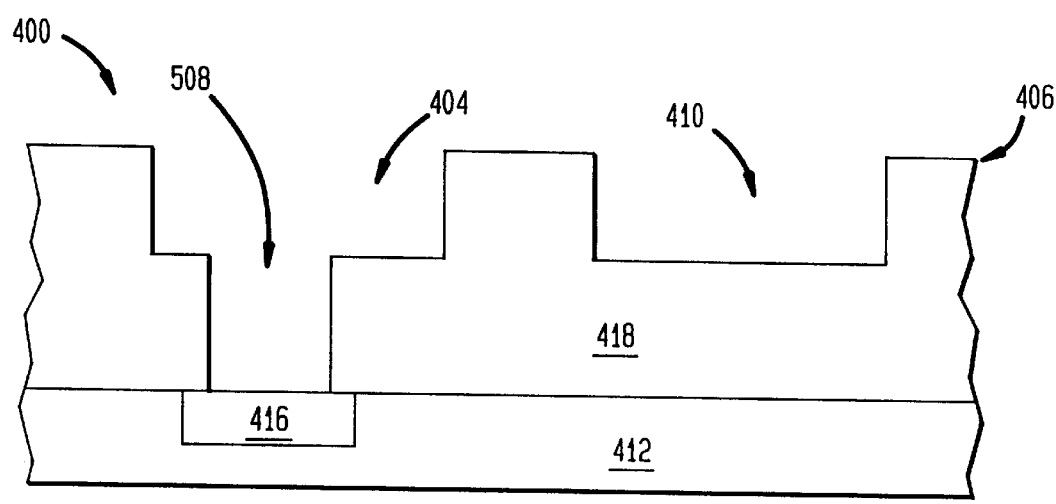
FIG. 2D shows, in accordance with one embodiment of the present invention, a cross sectional illustration of a semiconductor structure as shown in FIG. 2C in preparation for metal deposition.

FIG. 2D illustrates a cross sectional view of a semiconductor structure 400 in accordance with one embodiment of the present invention after completion of the formation of via hole 508. In FIG. 2D, the flowable oxide within trench 410 and trench 404 has been removed, as are the ARC layer and the via etch photoresist mask.

The metals may be deposited by known techniques such as chemical vapor deposition (CVD), physical vapor deposition (PVD), or low pressure chemical vapor deposition (LPCVD). The selection of particular equipment and process parameters for CVD, PVD and LPCVD is within the ability one skilled in the art of semiconductor processing. Deposition of the metal (usually in blanket fashion over the entire surface of the semiconductor structure) fills trench 410 and via hole 508 thereby substantially simultaneously forming the overlying metallization and associated via interconnects to the underlying device layer 416.

Figure 3:
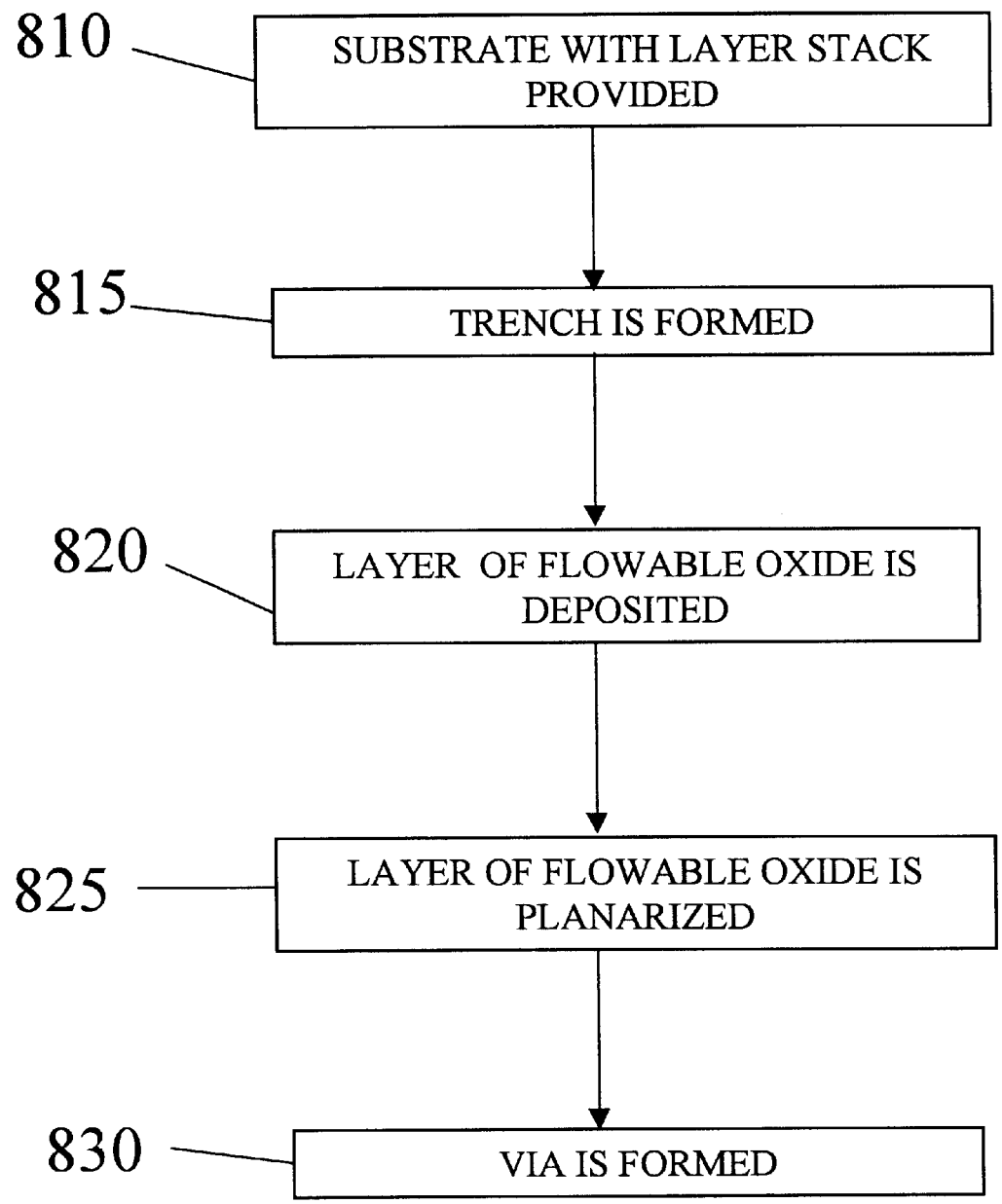
FIG. 3 is a flowchart detailing shows, in accordance with one embodiment of the present invention, the formation of multi-level coplanar metal/insulator films using dual damascene techniques with sacrificial flowable oxide.

The formation of multi-level coplanar metal/insulator films using dual damascene techniques with sacrificial flowable oxide which is detailed in the flowchart illustrated by FIG. 3 may include, in one embodiment of the present invention, the following operative steps.

In step 810, a substrate with a layer stack disposed above the substrate is provided. The layer stack includes an underlying device layer and an insulating layer disposed above said underlying device layer. With reference to FIG. 2A, the substrate is shown as substrate 412 and the underlying device layer is shown as device layer 416. Insulator layer 418 is shown disposed above the substrate and the underlying device layer 416.

In step 815 a trench is formed in the top surface of the insulator layer. In this embodiment, the trench is positioned above the underlying device layer with the insulator layer disposed between the bottom of trench and the underlying device layer. With reference to FIG. 2A, the trench is shown as trench 404.

In step 820, a layer of flowable oxide is deposited over the top surface of the insulator layer. This flowable oxide is shown in FIG. 2A as flowable oxide 400. In the described embodiment, flowable oxide is a polymeric compound that forms $SiO_2$. As described, the deposition may be performed by a spin on process or by any other conventional means known by those skilled in the art.

In step 825, the layer of flowable oxide is planarized down to about a level of the top surface of insulator layer as shown in FIG. 2B. In some cases, however, it is permissible to planarize even further, e.g., beyond the level of the previously existing top surface of the insulating layer.

FIG. 2C illustrates how in step 830 a via 508 is formed by etching through the flowable oxide within trench 404 and the insulator layer 418 at the bottom of trench 404 down to the underlying device layer 416.

Many advantages may be realized by utilization of the described method of performing the inventive dual damascene etch to form a via. One such advantage is the fact the dual damascene technique with flow oxide as described does not result in the formation of fences since the via holes are formed after the formation of the trenches in the upper surface of the insulator layer. In this manner, the deposited ARC material on the surface of insulator layer cannot become entrapped within the via holes since they have not yet been formed. This lack of fence formation facilitates subsequent metal deposition by allowing a smooth flow of metal into the via hole. In this manner, the metal flow into the via hole and trench is substantially uniform with no voids due to the absence of fences. This uniformity in metal deposition may result in improved long term reliability since localized electromigration due to the presence of metal voids in the via is reduced or substantially eliminated.

Another advantage of the invention relates to the fact that the flowable oxide surface is planarized prior to depositing the ARC layer. Since the ability of photolithography to adequately resolve small geometries is related to the planarity of the surface upon which the ARC deposition occurs, it is advantageous to have as planar a surface as is possible. As described, the flowable oxide permits a planar surface to be formed which, in contrast to conventional dual damascene techniques, facilitates the resolution of small geometries without investing in the best optical or electron beam lithography equipment available.

The many features and advantages of the present invention are apparent from the written description, and thus, it is intended by the appended claims to cover all such features and advantages of the invention. Further, since numerous modifications and changes will readily occur to those skilled in the art, it is not desired to limit the invention to the exact construction and operation as illustrated and described. Hence, all suitable modifications and equivalents may be resorted to as falling within the scope of the invention.

What is claimed is:

1. A method of performing a dual damascene etch through a layer stack comprising an underlying device layer, an insulating layer disposed above said underlying device layer, said method comprising:

forming a trench in a top surface of said insulating layer, said trench being positioned over said underlying device layer and separated therefrom by insulating material at a bottom of said trench;

depositing flowable oxide over said top surface of said insulating layer and into said trench;

planarizing said flowable oxide down to about a level of said top surface of said insulating layer;

etching through said flowable oxide within said trench and through the insulating material at said bottom of said trench down to said underlying device layer to form a via in communication with the trench; and depositing an anti-reflective layer above said flowable oxide to facilitate said etching through said flowable oxide and said insulating layer.

2. The method of claim 1 further comprising:

performing a break-through etch of said anti-reflective layer prior to said etching through said flowable oxide and said insulating material.

3. The method of claim 2 wherein said break-through etch employs an etchant source gas that includes $N_2$.

4. The method of claim 2 wherein said etching through said flowable oxide and said insulating material comprises:

etching in accordance with first etch parameters through said flowable oxide within said trench; and etching in accordance with second etch parameters through said insulating material at said bottom of said trench.

5. The method of claim 4 wherein at least one of said first parameters and said second parameters includes using an etchant source gas that comprises $C_4F_8$.

6. The method of claim 5 wherein said first parameters include a quantity of $O_2$ etchant source gas that is greater than a quantity of $O_2$ etchant source gas of said second parameters.

7. The method of claim 1 wherein said substrate represents a silicon wafer.

8. The method of claim 1 wherein said flowable oxide represents spin on glass (SOG).

9. The method of claim 1 wherein said planarizing is achieved by reactive ion etching.

10. The method of claim 1 wherein said substrate is employed in the manufacture of an integrated circuit.

11. The method of claim 1 wherein said substrate is employed in the manufacture of a dynamic random access memory.

12. A method of forming a via configured for connecting an underlying device layer and an overlying conductor of a layer stack, said overlying conductor being configured to be disposed in a trench formed in an insulating layer and spaced apart from said underlying device layer by insulating material at a bottom of said trench, said method comprising:

depositing flowable oxide over said top surface of a top surface of said insulating layer and into said trench;

planarizing said flowable oxide down to at least about a level of said top surface of said insulating layer;

etching through said flowable oxide within said trench and through said insulating material at said bottom of said trench down to said underlying device layer to form said via in communication with the trench; and depositing an anti-reflective layer above said flowable oxide to facilitate said etching through said flowable oxide and said insulating layer.

13. The method of claim 12 wherein said etching through said flowable oxide and said insulating material comprises:

etching in accordance with first etch parameters substantially through said flowable oxide within said trench; and etching in accordance with second etch parameters through said insulating material at said bottom of said trench.

14. The method of claim 13 further comprising:

forming a photoresist mask above said anti-reflective layer prior to said etching through said flowable oxide and said insulating material.

15. The method of claim 14 further comprising:

performing a break-through etch of said anti-reflective layer prior to said etching through said flowable oxide and said insulating material using said photoresist mask.

16. The method of claim 15 wherein said break-through etch employs an etchant source gas that includes $N_2$.

17. The method of claim 13 wherein at least one of said first parameters and said second parameters includes using an etchant source gas that comprises $C_4F_8$.

18. The method of claim 13 further comprising depositing conductive material into said via and said trench to form said overlying conductor and to electrically couple said overlying conductor with said underlying device layer.

19. The method of claim 13 wherein said substrate is employed in the manufacture of a dynamic random access memory.

20. A method of substantially reducing fence formation inside a via configured for connecting an underlying device layer and an overlying conductor of a layer stack, said overlying conductor being configured to be disposed in a trench formed in an insulating layer and spaced apart from said underlying device layer by insulating material at a bottom of said trench, said method comprising:

depositing a sufficient quantity of flowable oxide into said trench to completely cover said trench and over said top surface of said insulating layer;

planarizing said flowable oxide down to at least about a level of said top surface of said insulating layer to form a substantially planar surface; and etching through said flowable oxide within said trench and through said insulating material at said bottom of said trench down to at least said underlying device layer to form said via.

21. The method of claim 20 wherein said substrate is employed in the manufacture of a dynamic random access memory.

22. The method of claim 20 wherein said device layer represents a conductive layer.

23. The method of claim 20 wherein said device layer represents a doped silicon layer.

* * * * *